United States Patent [19]
Colbeth et al.

[11] Patent Number: 6,084,461
[45] Date of Patent: *Jul. 4, 2000

[54] CHARGE SENSITIVE AMPLIFIER WITH HIGH COMMON MODE SIGNAL REJECTION

[75] Inventors: Richard E. Colbeth, Los Altos; Max J. Allen, Cupertino, both of Calif.; Martin Mallinson, British Columbia, Canada

[73] Assignee: Varian Medical Systems, Inc., Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/758,538

[22] Filed: Nov. 29, 1996

[51] Int. Cl.$^7$ ................................................. H03K 17/60
[52] U.S. Cl. ........................................ 327/432; 327/362
[58] Field of Search ................................. 327/432, 433, 327/362, 560, 562, 563, 574, 77, 80, 81; 326/109, 110, 84; 330/258

[56] References Cited

U.S. PATENT DOCUMENTS

| | | | |
|---|---|---|---|
| 4,216,435 | 8/1980 | Ahmed | 330/254 |
| 4,220,873 | 9/1980 | Giordano | 327/432 |
| 4,366,522 | 12/1982 | Baker | 327/432 |
| 4,596,958 | 6/1986 | Graeme et al. | 330/253 |
| 4,740,722 | 4/1988 | Furuhata | 327/432 |
| 4,746,814 | 5/1988 | Shigekane | 327/432 |
| 5,576,646 | 11/1996 | Rezzi et al. | 327/433 |
| 5,689,197 | 11/1997 | Sugawara | 326/110 |

FOREIGN PATENT DOCUMENTS

| | | | |
|---|---|---|---|
| 0 159 654 A2 | 10/1985 | European Pat. Off. | H03F 3/45 |

OTHER PUBLICATIONS

J Ramirez–Angulo, "Low–Voltage BICMOS and Vertical OTA", IEE Proceedings–G, vol. 139, No. 4, Aug. 1992, pps. 553–556.

Handbook edited by Richard C. Dorf entitled "The Electrical Engineering Handbook", published in 1993—pp. 1804–1805.

Article by J.C. Stanton and N. Kurtz, entitled "An Introduction to the MX Chip", published on Apr. 11, 1989, pp. 1–14.

Article by Paul R. Gray and Robert G. Meyer, entitled "Analysis and Design of Analog Integrated Circuits, Third Edition", published in 1993—John Wiley and Sons, Inc., p. 465.

*Primary Examiner*—Toan Tran
*Attorney, Agent, or Firm*—Bradford L. Friedman; Hunter L. Auyang; Mark A. Dalla Valle

[57] ABSTRACT

A charge sensitive amplifier with high common mode signal rejection includes an NPN bipolar junction transistor (BJT) and a P-channel metal oxide semiconductor field effect transistor (MOSFET) connected in a totem pole circuit configuration. The BJT base terminal receives a dc reference voltage, the MOSFET gate terminal receives the incoming data signal, the MOSFET drain terminal is grounded and the BJT collector terminal provides the output voltage signal and is biased by the power supply through a resistive circuit element. The MOSFET operates as a source follower amplifier with the transconductance of the BJT serving as the load at the source terminal, while the BJT operates as a common emitter amplifier with the transconductance of the MOSFET providing emitter degeneration. The signal gains of such source follower and common emitter amplifiers are substantially equal and of opposite polarities. Therefore, any common mode signal components due to common mode input signals present at the input terminals (i.e., the BJT base and MOSFET gate terminals) which would otherwise appear within the output signal are substantially cancelled, thereby resulting in a high degree of common mode signal rejection.

26 Claims, 3 Drawing Sheets

CHARGE SENSITIVE AMPLIFIER WITH HIGH COMMON MODE SIGNAL REJECTION

FIELD OF THE INVENTION

The present invention relates to charge sensitive amplifiers, and in particular, to charge sensitive amplifiers with differential input terminals and high common mode signal rejection.

BACKGROUND OF THE INVENTION

Charge sensitive amplifiers play an important role in imaging systems due to the low capacity of the subject signals in terms of current, i.e., charge, and duty cycle. For example, in large area, flat panel imaging systems, such as imaging systems for medical and document imaging applications based upon amorphous silicon, the image sensor is typically arranged as an array of pixels, each of which consists of a photo sensitive element and a thin film transistor (TFT).

In order achieve imaging frame rates suitable for video processing and display, all gate and data line connections for the sensor are brought out to the edge of the array for connection to an off-array control circuit containing row selection and charge sensing circuitry. As the resolution of such an array increases, more pixels become necessary for each data line, with the result being less signal capacity for each pixel. Further, as the number of pixels increases for a given active sensor area, the total parasitic capacitance on each data line increases since the size of each TFT is dictated by the rate at which the imaging information is read out, or sampled, from the array, and therefore, cannot generally be scaled linearly in accordance with the pixel pitch.

In fluoroscopic imaging, the signal levels associated with the minimum dose rate may be as low as 600 electrons, while the parasitic capacitance of each data line is approximately 100 picofarads. Under these circumstances, the difficulty for any charge sensitive amplifier connected to such a data line is to limit both the 1/f and thermal noise components of the amplifier and the input-referred power supply noise to a value less than one microvolt.

A conventional strategy for limiting charge sensitive amplifier noise is to use a single sided architecture with a large p-channel metal oxide semiconductor field effect transistor (P-MOSFET) as the input device. This single sided architecture can reduce the amplifier noise by a factor as great as the square root of two.

For many applications, the biggest noise problem related to the power supply involves power supply noise from on-chip digital switching circuits. In large area imaging, the pixels require biasing which is coupled, at least capacitively if not directly, to the data lines. Hence, the noise on the power supplies which bias the array is directly coupled to the input of the charge sensitive amplifiers which are connected to the data lines. Since limiting the power supply noise to a value of one microvolt RMS is a very difficult task, it is necessary to somehow reject the power supply noise injected at the input. Unfortunately, the ideal structure for rejecting this noise is a differential input amplifier which requires a second P-MOSFET, thereby increasing the amplifier noise across the parasitic data line capacitance by a factor of at least the square root of two.

Accordingly, it would be desirable to have a charge sensitive amplifier which is capable of rejecting power supply noise without increasing its own amplifier noise.

SUMMARY OF THE INVENTION

A charge sensitive amplifier in accordance with the present invention has high common mode signal rejection for rejecting input referred noise, as well as high power supply noise rejection. Such a charge sensitive amplifier can be used advantageously in multiple channel charge sensitive amplifier chips for reading out imaging data from large area image sensors, such as imaging systems for medical and document imaging applications based upon amorphous silicon.

A charge sensitive amplifier with high common mode signal rejection in accordance with one embodiment of the present invention includes a current controlled transistor circuit, a voltage controlled transistor circuit and an output circuit. The current controlled transistor circuit is configured to receive a dc input reference with a common mode input signal and in accordance therewith provide a first common mode signal component. The ratio of the first common mode signal component to the common mode input signal equals a first signal gain. The voltage controlled transistor circuit is coupled to the current controlled transistor circuit and is configured to receive a data input signal with the common mode input signal and in accordance therewith provide a data signal component and a second common mode signal component. The ratio of the second common mode signal component to the common mode input signal equals a second signal gain. The output circuit is coupled to one or both of the current and voltage controlled transistor circuits and is configured to receive and combine the data signal component and the first and second common mode signal components and in accordance therewith provide an output signal which corresponds to the data input signal. The ratio of the output signal to the data input signal substantially equals the second signal gain. The first and second signal gains are substantially equal and of opposite polarities and the first and second common mode signal components substantially cancel one another.

In a preferred embodiment of the present invention, the current and voltage controlled transistor circuits are coupled together in a totem pole circuit configuration and have semiconductor output regions of opposite conductivity types (e.g., an NPN bipolar junction transistor (BJT) and a P-channel metal oxide semiconductor field effect transistor (MOSFET), respectively, or a PNP BJT and an N-channel MOSFET, respectively). In an alternative embodiment, the current and voltage controlled transistor circuits are coupled together in an opposing circuit configuration and have semiconductor output regions of the same conductivity type (e.g., an NPN BJT and an N-channel MOSFET, respectively, or a PNP BJT and a P-channel MOSFET, respectively).

These and other features and advantages of the present invention will be understood upon consideration of the following detailed description of the invention and the accompanying drawings.

DETAILED DESCRIPTION OF THE PREFERRED EMBODIMENT

Figure 1:
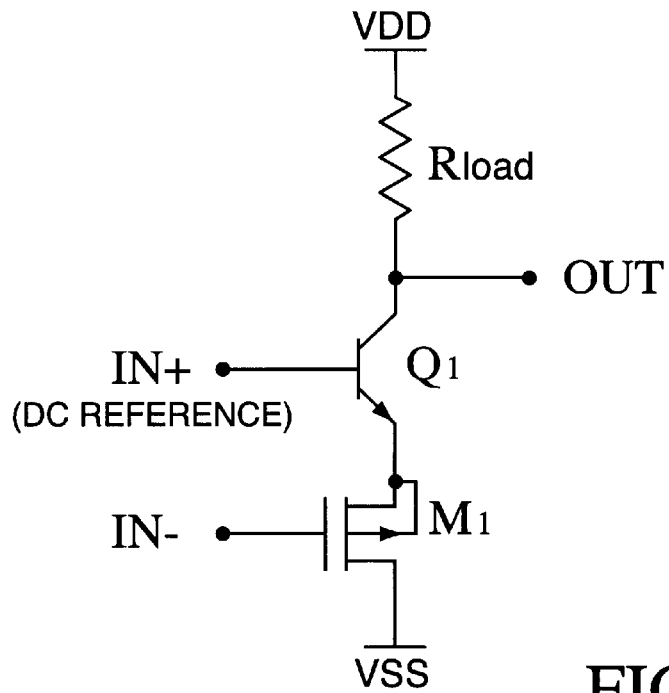
FIG. 1 is a simplified schematic diagram of a charge sensitive amplifier in accordance with one embodiment of the present invention.

Referring to FIG. 1, a charge sensitive amplifier with high common mode signal rejection in accordance with one embodiment of the present invention includes a current controlled transistor circuit in the form of an NPN bipolar junction transistor (BJT) Q1, a voltage controlled transistor circuit in the form of a P-channel metal oxide semiconductor field effect transistor (P-MOSFET) M1 and an output circuit in the form of a load resistance Rload, interconnected in a totem pole circuit configuration as shown. This differential amplifier configuration has its "positive," i.e., noninverting, input terminal at the base of transistor Q1 and its "negative," i.e., inverting, input at the gate of transistor M1. Using a BJT at the noninverting input advantageously substitutes a shot noise generator in the emitter current of a BJT for the noise voltage generator associated with a MOSFET gate. (It should be noted that the charge sensitive amplifier with high common mode signal rejection is typically followed by an inverting gain stage which would, in most applications, reside within the feedback loop. Hence, the "inverting" and "noninverting" designations are used herein based upon the assumption that such inverting gain stage is present.)

The base terminal of transistor Q1 receives the noninverting input signal IN+, while the gate of transistor M1 receives the inverting input signal IN−. When used in an imaging system, the noninverting input signal, IN+ is a positive reference voltage, while the inverting input signal IN− is the input signal from a selected column of pixel elements within the sensor array. With the resistive load Rload at the collector of transistor Q1, the output signal OUT is an amplified signal with high common mode input signal rejection. This high common mode input signal rejection is realized due to the substantially equal signal gains from the inputs IN+, IN− to the output OUT.

The substantially equal signal gains A+, A− from the inputs IN+, IN− to the output OUT can be seen based upon the following analysis. From the inverting input IN− to the output OUT the signal gain A− is the product of the gain from the inverting input IN− to the emitter of transistor Q1 multiplied by the gain from the emitter of transistor Q1 to the output OUT. Hence, the inverting input signal gain A− is the gain (transconductance) $g_m^{M1}$ of transistor M1 as a source follower, with the transconductance of transistor Q1 as its load, multiplied by the gain (transconductance) $g_m^{Q1}$ of the common base amplifier formed by transistor Q1 and the load resistance Rload. This can be expressed as follows:

$$A- = \frac{g_m^{M1}}{g_m^{M1} + g_m^{Q1}} \cdot (g_m^{Q1} \cdot R_{LOAD}) \quad (1a)$$

$$A- = \frac{g_m^{M1} \cdot g_m^{Q1} \cdot R_{LOAD}}{g_m^{M1} + g_m^{Q1}} \quad (1b)$$

With respect to the noninverting input signal IN+, the input stage is transistor Q1 as a common emitter amplifier with its emitter degeneration equal to the transconductance of transistor M1. Accordingly, the noninverting input signal gain A+ can be expressed as follows:

$$A+ = \frac{g_m^{Q1} \cdot R_{LOAD}}{1 + \frac{g_m^{Q1}}{g_m^{M1}}} \quad (2a)$$

$$A+ = \frac{g_m^{M1} \cdot g_m^{Q1} \cdot R_{LOAD}}{g_m^{M1} + g_m^{Q1}} \quad (2b)$$

Based upon the foregoing, it can be seen that, at least to a first order approximation, the inverting A− and noninverting A+ input signal gains are substantially equal. While this analysis is approximate in the sense that a number of higher order effects have not been considered (such as back gate modulation in transistor M1), circuit simulations using models for a 0.8 micron BiCMOS process demonstrate gain matching to within 0.5%, i.e., 46 dB of common mode signal rejection.

In addition to the high common mode signal rejection provided, the circuit of FIG. 1 also exhibits large rejection of noise received via its power supply terminals VDD, VSS. Such rejection is due to the fact that the impedances looking into the amplifier from power supply terminals VDD and VSS (i.e., the load resistance Rload in series with the collector impedance of transistor Q1, and the drain impedance of transistor M1, respectively) is very high, thereby effectively isolating the input terminals IN+, IN− from modulating signals, e.g., noise on the power supply terminals VDD, VSS.

One characteristic of this circuit which, depending upon the particular application, may be viewed as a disadvantage is the relatively large input offset voltage (approximately 1.5 volts) necessary between the two input terminals IN+, IN−. However, for many applications involving charge sensitive amplifiers such as this, the noninverting input signal IN+ is typically a DC reference voltage. Hence, such an input offset voltage requirement is not a problem.

Figure 2:
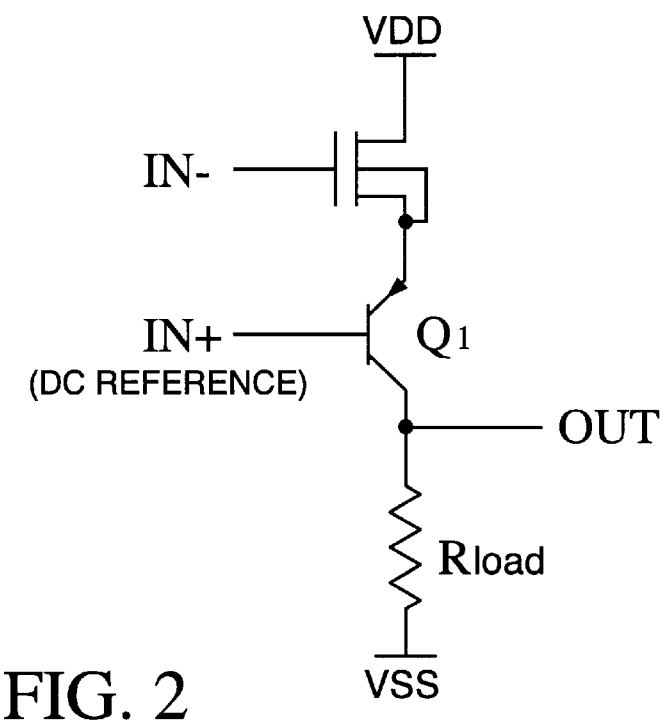
FIG. 2 is a simplified schematic diagram of an alternative embodiment of the charge sensitive amplifier of FIG. 1.

Referring to FIG. 2, an alternative embodiment of the charge sensitive amplifier of FIG. 1 uses a current controlled transistor circuit in the form of a PNP BJT for transistor Q1 and a voltage controlled transistor circuit in the form of an N-channel MOSFET for transistor M1, with their respective interconnections reversed accordingly. While exhibiting substantially the same advantages as the charge sensitive amplifier of FIG. 1, this embodiment does have one disadvantage in that using an N-MOSFET as the signal input device results in a higher level of 1/f noise.

Figure 3:
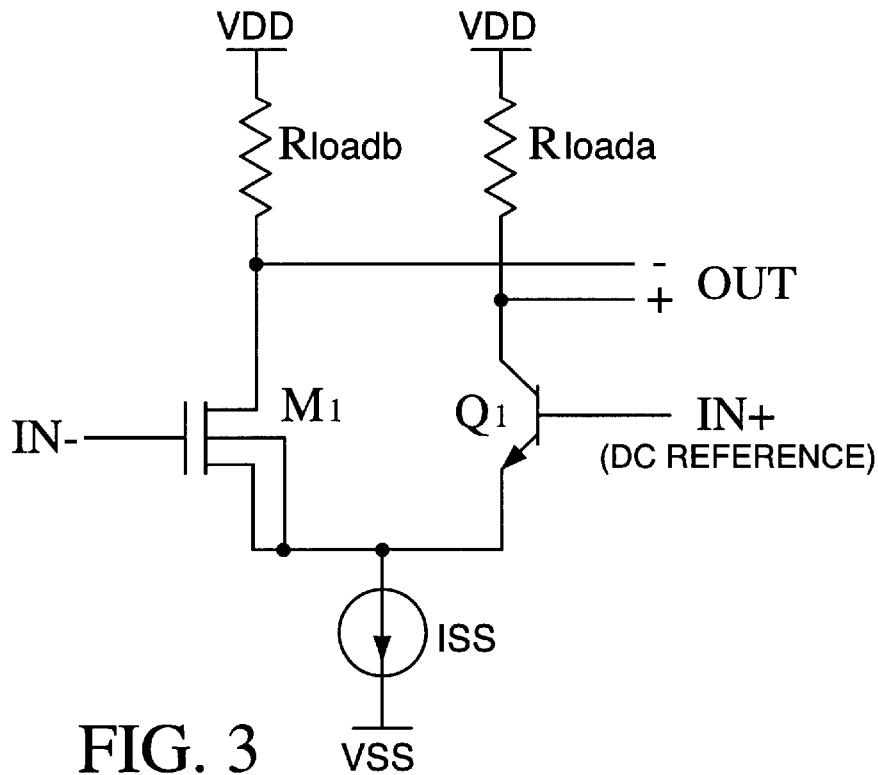
FIG. 3 is a simplified schematic diagram of a charge sensitive amplifier in accordance with another embodiment of the present invention.

Referring to FIG. 3, an alternative embodiment of a charge sensitive amplifier in accordance with the present invention uses NPN BJT Q1 and N-MOSFET M1 in an opposing circuit configuration biased with a current source ISS and providing a differential output signal OUT. While this embodiment exhibits substantially the same advantages as the charge sensitive amplifier of FIG. 1, one disadvantage is higher 1/f noise due to the use of an N-MOSFET as the signal input device.

Figure 4:
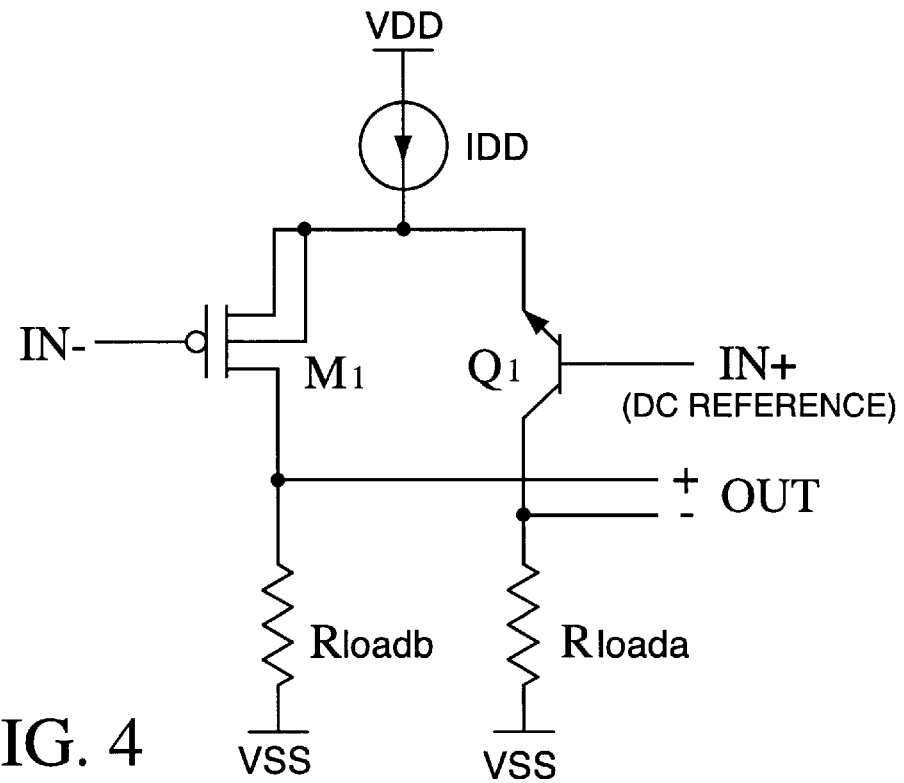
FIG. 4 is a simplified schematic diagram of an alternative embodiment of the charge sensitive amplifier of FIG. 3.

Referring to FIG. 4, an alternative embodiment of the charge sensitive amplifier of FIG. 3 uses PNP BJT Q1 and P-MOSFET M1 in an opposing circuit configuration biased with a current source IDD and providing a differential output signal OUT. While this embodiment also exhibits substantially the same advantages as the charge sensitive amplifier of FIG. 1, one disadvantage is lower gain due to the use of a PNP BJT.

Figure 5:
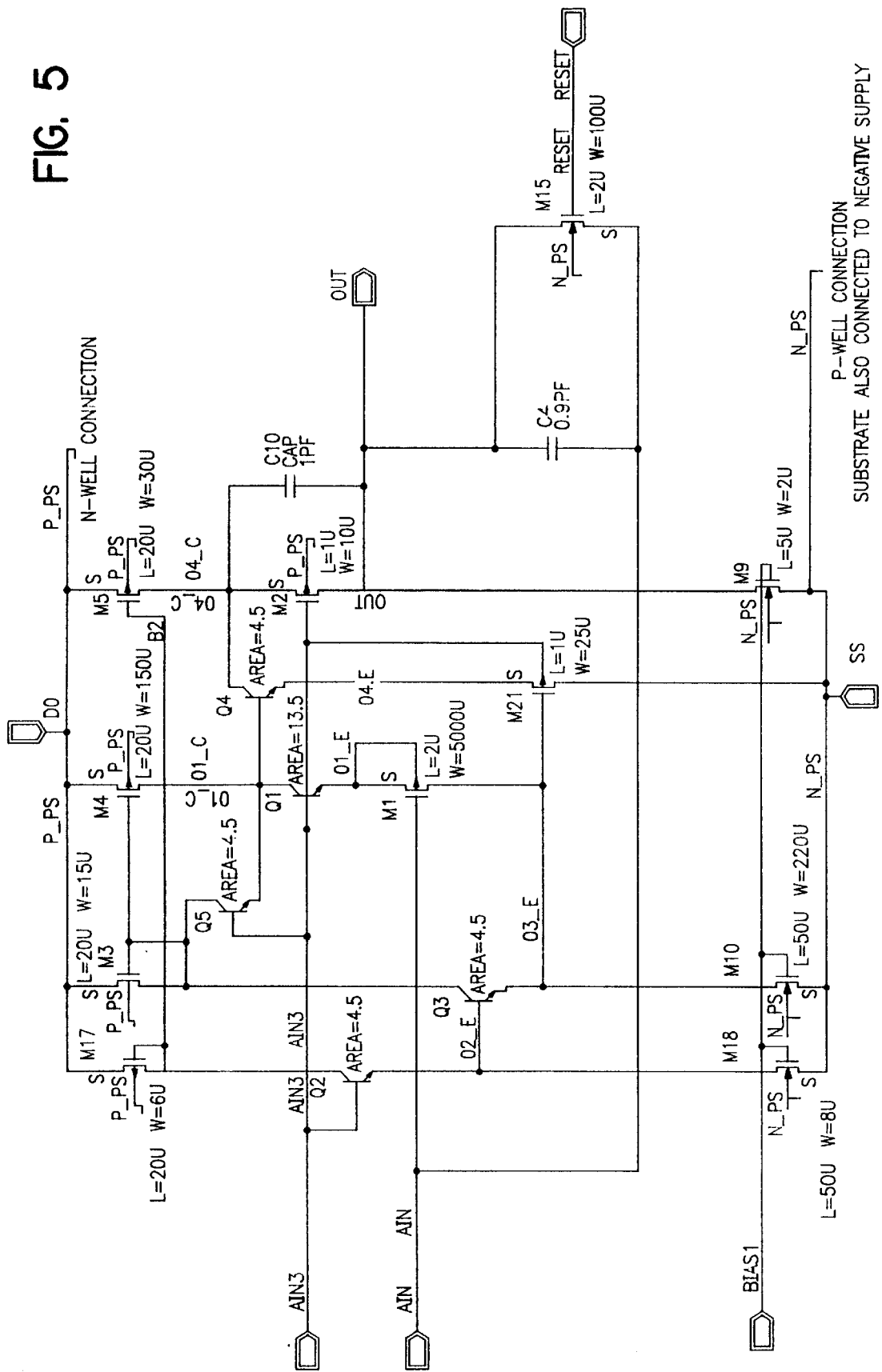
FIG. 5 is a detailed schematic diagram of an amplifier containing the charge sensitive amplifier circuit of FIG. 1.

Referring to FIG. 5, an amplifier circuit containing a charge sensitive amplifier in accordance with the present invention, specifically the circuit of FIG. 1, has NPN BJT Q1 and P-MOSFET M1 coupled between positive VDD and negative VSS power supply terminals. The load resistance at the collector of transistor Q1 is implemented in the form of resistive circuit elements provided by P-MOSFET M4 and NPN BJTs Q4 and Q5. The drain terminal of transistor M1 is coupled to the negative power supply terminal VSS via the channel of P-MOSFET M10. As noted above, the noninverting input AINB is a DC reference voltage of approximately 2.5 volts, while the inverting input signal AIN is a data signal centered about a DC level of approximately 1 volt.

Based upon the foregoing, it can be seen that a charge sensitive amplifier in accordance with the present invention has a number of advantages when used in charged integrating amplifier: differential input; low input referred thermal and 1/f noise; high power supply rejection ratio; high common mode rejection ratio; and a high impedance input terminal.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a charge sensitive amplifier with high common mode signal rejection, said charge sensitive amplifier comprising:

a current controlled transistor circuit configured to receive a dc input reference with a common mode input signal and in accordance therewith provide a first common mode signal component, wherein a ratio of said first common mode signal component to said common mode input signal equals a first signal gain;

a voltage controlled transistor circuit, coupled to said current controlled transistor circuit, configured to receive a data input signal with said common mode input signal and in accordance therewith provide a data signal component and a second common mode signal component, wherein a ratio of said second common mode signal component to said common mode input signal equals a second signal gain; and an output circuit, coupled to one or both of said current and voltage controlled transistor circuits, configured to receive and combine said data signal component and said first and second common mode signal components and in accordance therewith provide an output signal which corresponds to said data input signal, wherein a ratio of said output signal to said data input signal substantially equals said second signal gain;

wherein said data input signal is single-ended and said dc input reference and said data input signal are unrelated to one another;

wherein said first and second signal gains are substantially equal and of opposite polarities and said first and second common mode signal components substantially cancel one another; and wherein said current and voltage controlled transistor circuits are coupled together in a totem pole circuit configuration.

2. The apparatus of claim 1, wherein said current controlled transistor circuit includes a first semiconductor output region of a first conductivity type from which said first common mode signal component is provided, said voltage controlled transistor circuit includes a second semiconductor output region of a second conductivity type from which said data signal component and said second common mode signal component are provided, and said first and second conductivity types are of opposite conductivity types.

3. The apparatus of claim 2, wherein said current controlled transistor circuit comprises an NPN bipolar junction transistor and said voltage controlled transistor circuit comprises a P-channel metal oxide semiconductor field effect transistor.

4. The apparatus of claim 2, wherein said current controlled transistor circuit comprises a PNP bipolar junction transistor and said voltage controlled transistor circuit comprises an N-channel metal oxide semiconductor field effect transistor.

5. An apparatus including a charge sensitive amplifier with high common mode signal rejection, said charge sensitive amplifier comprising:

a current controlled transistor circuit configured to receive a dc input reference with a common mode input signal and in accordance therewith provide a first common mode signal component, wherein a ratio of said first common mode signal component to said common mode input signal equals a first signal gain;

a voltage controlled transistor circuit, coupled to said current controlled transistor circuit, configured to receive a data input signal with said common mode input signal and in accordance therewith provide a data signal component and a second common mode signal component, wherein a ratio of said second common mode signal component to said common mode input signal equals a second signal gain; and an output circuit, coupled to one or both of said current and voltage controlled transistor circuits, configured to receive and combine said data signal component and said first and second common mode signal components and in accordance therewith provide an output signal which corresponds to said data input signal, wherein a ratio of said output signal to said data input signal substantially equals said second signal gain;

wherein said data input signal is single-ended and said dc input reference and said data input signal are unrelated to one another;

wherein said first and second signal gains are substantially equal and of opposite polarities and said first and second common mode signal components substantially cancel one another; and wherein said current and voltage controlled transistor circuits are coupled together in an opposing circuit configuration and said output signal comprises a differential output signal with first and second opposing signal phases provided by said current and voltage controlled transistor circuits, respectively.

6. The apparatus of claim 5, wherein said current controlled transistor circuit includes a first semiconductor output region of a conductivity type from which said first common mode signal component is provided and said voltage controlled transistor circuit includes a second semiconductor output region of said conductivity type from which said data signal component and said second common mode signal component are provided.

7. The apparatus of claim 6, wherein said current controlled transistor circuit comprises a PNP bipolar junction transistor and said voltage controlled transistor circuit comprises a P-channel metal oxide semiconductor field effect transistor.

8. The apparatus of claim 6, wherein said current controlled transistor circuit comprises an NPN bipolar junction transistor and said voltage controlled transistor circuit comprises an N-channel metal oxide semiconductor field effect transistor.

9. The apparatus of claim 5, wherein said output circuit comprises a plurality of circuit elements exhibiting a plurality of circuit resistance characteristics.

10. An apparatus including a bipolar and metal oxide semiconductor charge sensitive amplifier with high common mode signal rejection, said charge sensitive amplifier comprising:
   a bipolar junction transistor (BJT) configured to receive a dc input reference with a common mode input signal and in accordance therewith provide a first common mode signal component, wherein a ratio of said first common mode signal component to said common mode input signal equals a first signal gain;
   a metal oxide semiconductor field effect transistor (MOSFET), coupled to said BJT, configured to receive a data input signal with said common mode input signal and in accordance therewith provide a data signal component and a second common mode signal component, wherein a ratio of said second common mode signal component to said common mode input signal equals a second signal gain; and
   a resistive output circuit, coupled to one or both of said BJT and said MOSFET, configured to receive and combine said first and second common mode signal components and said data signal component and in accordance therewith provide an output signal which corresponds to said data input signal, wherein a ratio of said output signal to said data input signal substantially equals said second signal gain;
   wherein said data input signal is single-ended and said dc input reference and said data input signal are unrelated to one another;
   wherein said first and second signal gains are substantially equal and of opposite polarities and said first and second common mode signal components substantially cancel one another; and
   wherein said BJT and said MOSFET are coupled together in a totem pole circuit configuration.

11. The apparatus of claim 10, wherein said BJT includes a first semiconductor output region of a first conductivity type from which said first common mode signal component is provided, said MOSFET includes a second semiconductor output region of a second conductivity type from which said data signal component and said second common mode signal component are provided, and said first and second conductivity types are of opposite conductivity types.

12. The apparatus of claim 11, wherein said BJT comprises an NPN BJT and said MOSFET comprises a P-channel MOSFET.

13. The apparatus of claim 12, wherein said BJT comprises a PNP BJT and said MOSFET comprises an N-channel MOSFET.

14. An apparatus including a bipolar and metal oxide semiconductor charge sensitive amplifier with high common mode signal rejection, said charge sensitive amplifier comprising:
   a bipolar junction transistor (BJT) configured to receive a dc input reference with a common mode input signal and in accordance therewith provide a first common mode signal component, wherein a ratio of said first common mode signal component to said common mode input signal equals a first signal gain;
   a metal oxide semiconductor field effect transistor (MOSFET), coupled to said BJT, configured to receive a data input signal with said common mode input signal and in accordance therewith provide a data signal component and a second common mode signal component, wherein a ratio of said second common mode signal component to said common mode input signal equals a second signal gain; and
   a resistive output circuit, coupled to one or both of said BJT and said MOSFET, configured to receive and combine said first and second common mode signal components and said data signal component and in accordance therewith provide an output signal which corresponds to said data input signal, wherein a ratio of said output signal to said data input signal substantially equals said second signal gain;
   wherein said data input signal is single-ended and said dc input reference and said data input signal are unrelated to one another;
   wherein said first and second signal gains are substantially equal and of opposite polarities and said first and second common mode signal components substantially cancel one another; and
   wherein said BJT and said MOSFET are coupled together in an opposing circuit configuration and said output signal comprises a differential output signal with first and second opposing signal phases provided by said BJT and MOSFET, respectively.

15. The apparatus of claim 14, wherein said BJT includes a first semiconductor output region of a conductivity type from which said first common mode signal component is provided and said MOSFET includes a second semiconductor output region of said conductivity type from which said data signal component and said second common mode signal component are provided.

16. The apparatus of claim 15, wherein said BJT comprises a PNP BJT and said MOSFET comprises a P-channel MOSFET.

17. The apparatus of claim 15, wherein said BJT comprises an NPN BJT and said MOSFET comprises an N-channel MOSFET.

18. A method of amplifying a charge sensitive signal with high common mode signal rejection, said method comprising the steps of:
   receiving a dc input reference with a common mode input signal and in accordance therewith generating a first common mode signal component with a current controlled transistor circuit, wherein a ratio of said first common mode signal component to said common mode input signal equals a first signal gain;
   receiving a data input signal with said common mode input signal and in accordance therewith generating a data signal component and a second common mode signal component with a voltage controlled transistor circuit, wherein said current and voltage controlled transistor circuits are coupled together in a totem pole circuit configuration and a ratio of said second common mode signal component to said common mode input signal equals a second signal gain; and
   combining said first and second common mode signal components and said data signal component and in accordance therewith generating an output signal which corresponds to said data input signal, wherein a ratio of said output signal to said data input signal substantially equals said second signal gain:

wherein said data input signal is single-ended and said dc input reference and said data input signal are unrelated to one another; and wherein said first and second signal gains are substantially equal and of opposite polarities and said first and second common mode signal components substantially cancel one another.

19. The method of claim 18, wherein:

said step of receiving a dc input reference with a common mode input signal and in accordance therewith generating a first common mode signal component with a current controlled transistor circuit comprises receiving said dc input reference with said common mode input signal and in accordance therewith generating said first common mode signal component with said current controlled transistor circuit including a first semiconductor output region of a first conductivity type from which said first common mode signal component is provided;

said step of receiving a data input signal with said common mode input signal and in accordance therewith generating a data signal component and a second common mode signal component with a voltage controlled transistor circuit comprises receiving said data input signal with said common mode input signal and in accordance therewith generating said data signal component and said second common mode signal component with said voltage controlled transistor circuit including a second semiconductor output region of a second conductivity type from which said data signal component and said second common mode signal component are provided; and said first and second conductivity types are of opposite conductivity types.

20. The method of claim 19, wherein:

said step of receiving a dc input reference with a common mode input signal and in accordance therewith generating a first common mode signal component with a current controlled transistor circuit comprises receiving said dc input reference with said common mode input signal and in accordance therewith generating said first common mode signal component with an NPN bipolar junction transistor; and said step of receiving a data input signal with said common mode input signal and in accordance therewith generating a data signal component and a second common mode signal component with a voltage controlled transistor circuit comprises receiving said data input signal with said common mode input signal and in accordance therewith generating said data signal component and said second common mode signal component with a P-channel metal oxide semiconductor field effect transistor.

21. The method of claim 19, wherein:

said step of receiving a dc input reference with a common mode input signal and in accordance therewith generating a first common mode signal component with a current controlled transistor circuit comprises receiving said dc input reference with said common mode input signal and in accordance therewith generating said first common mode signal component with a PNP bipolar junction transistor; and said step of receiving a data input signal with said common mode input signal and in accordance therewith generating a data signal component and a second common mode signal component with a voltage controlled transistor circuit comprises receiving said data input signal with said common mode input signal and in accordance therewith generating said data signal component and said second common mode signal component with an N-channel metal oxide semiconductor field effect transistor.

22. A method of amplifying a charge sensitive signal with high common mode signal rejection, said method comprising the steps of:

receiving a dc input reference with a common mode input signal and in accordance therewith generating a first common mode signal component with a current controlled transistor circuit, wherein a ratio of said first common mode signal component to said common mode input signal equals a first signal gain;

receiving a data input signal with said common mode input signal and in accordance therewith generating a data signal component and a second common mode signal component with a voltage controlled transistor circuit, wherein said current and voltage controlled transistor circuits are coupled together in an opposing circuit configuration and a ratio of said second common mode signal component to said common mode input signal equals a second signal gain; and combining said first and second common mode signal components and said data signal component and in accordance therewith generating an output signal which corresponds to said data input signal, wherein a ratio of said output signal to said data input signal substantially equals said second signal gain;

wherein said data input signal is single-ended and said dc input reference and said data input signal are unrelated to one another;

wherein said first and second signal gains are substantially equal and of opposite polarities and said first and second common mode signal components substantially cancel one another; and wherein said output signal comprises a differential output signal with first and second opposing signal phases provided by said current and voltage controlled transistor circuits, respectively.

23. The method of claim 22, wherein:

said step of receiving a dc input reference with a common mode input signal and in accordance therewith generating a first common mode signal component with a current controlled transistor circuit comprises receiving said dc input reference with said common mode input signal and in accordance therewith generating said first common mode signal component with said current controlled transistor circuit including a first semiconductor output region of a conductivity type from which said first common mode signal component is provided; and said step of receiving a data input signal with said common mode input signal and in accordance therewith generating a data signal component and a second common mode signal component with a voltage controlled transistor circuit comprises receiving said data input signal with said common mode input signal and in accordance therewith generating said data signal component and said second common mode signal component with said voltage controlled transistor circuit including a second semiconductor output region of said conductivity type from which said data signal component and said second common mode signal component are provided.

24. The method of claim 23, wherein:

said step of receiving a dc input reference with a common mode input signal and in accordance therewith generating a first common mode signal component with a current controlled transistor circuit comprises receiving said dc input reference with said common mode input signal and in accordance therewith generating said first common mode signal component with a PNP bipolar junction transistor; and said step of receiving a data input signal with said common mode input signal and in accordance therewith generating a data signal component and a second common mode signal component with a voltage controlled transistor circuit comprises receiving said data input signal with said common mode input signal and in accordance therewith generating said data signal component and said second common mode signal component with a P-channel metal oxide semiconductor field effect transistor.

25. The method of claim 23, wherein:

said step of receiving a dc input reference with a common mode input signal and in accordance therewith generating a first common mode signal component with a current controlled transistor circuit comprises receiving said dc input reference with said common mode input signal and in accordance therewith generating said first common mode signal component with an NPN bipolar junction transistor; and said step of receiving a data input signal with said common mode input signal and in accordance therewith generating a data signal component and a second common mode signal component with a voltage controlled transistor circuit comprises receiving said data input signal with said common mode input signal and in accordance therewith generating said data signal component and said second common mode signal component with an N-channel metal oxide semiconductor field effect transistor.

26. The method of claim 2, wherein said step of combining said first and second common mode signal components and said data signal component and in accordance therewith generating an output signal which corresponds to said data input signal comprises combining said first and second common mode signal components and said data signal component and in accordance therewith generating said output signal which corresponds to said data input signal with a plurality of circuit elements exhibiting a plurality of circuit resistance characteristics.

* * * * *